US012660134B2

(12) United States Patent
Reddy et al.

(10) Patent No.: US 12,660,134 B2
(45) Date of Patent: Jun. 16, 2026

(54) VEHICULAR DRIVING ASSIST SYSTEM WITH INTEGRATED ADAS AND INFOTAINMENT CIRCUITRY

(71) Applicant: Magna Electronics Inc., Auburn Hills, MI (US)

(72) Inventors: Sharath Pulimamidi Reddy, Commerce Township, MI (US); Suresh Boddi, New Hudson, MI (US); Sujith Gurram, Orion Township, MI (US)

(73) Assignee: Magna Electronics Inc., Auburn Hills, MI (US)

( * ) Notice: Subject to any disclaimer, the term of this patent is extended or adjusted under 35 U.S.C. 154(b) by 234 days.

(21) Appl. No.: 18/468,793

(22) Filed: Sep. 18, 2023

(65) Prior Publication Data

US 2024/0098947 A1     Mar. 21, 2024

Related U.S. Application Data

(60) Provisional application No. 63/376,137, filed on Sep. 19, 2022.

(51) Int. Cl.
*H05K 7/20*       (2006.01)
*B60R 16/023*     (2006.01)
*H05K 7/14*       (2006.01)

(52) U.S. Cl.
CPC ..... *H05K 7/20872* (2013.01); *B60R 16/0231* (2013.01); *H05K 7/1427* (2013.01)

(58) Field of Classification Search
CPC .............. H05K 7/20872; H05K 7/1427; B60R 16/0231
See application file for complete search history.

(56) References Cited

U.S. PATENT DOCUMENTS

| | | | |
|---|---|---|---|
| 5,596,228 A | 1/1997 | Anderton et al. | |
| 8,154,418 B2 | 4/2012 | Peterson et al. | |
| 9,036,026 B2 | 5/2015 | Dellantoni et al. | |
| 10,850,693 B1 | 12/2020 | Pertsel et al. | |
| 10,981,520 B1 | 4/2021 | Mutyala et al. | |
| 11,816,905 B2 | 11/2023 | Kasarla et al. | |
| 12,086,308 B2 | 9/2024 | Kasarla et al. | |
| 2004/0093155 A1* | 5/2004 | Simonds ............. | B60R 16/0231 701/532 |
| 2007/0188347 A1 | 8/2007 | Schofield | |

(Continued)

*Primary Examiner* — Joseph L Greene
(74) *Attorney, Agent, or Firm* — HONIGMAN LLP

(57) ABSTRACT

A vehicular integrated ADAS/infotainment module includes first electronic circuitry disposed at a printed circuit board and second electronic circuitry disposed at the printed circuit board. With the vehicular integrated ADAS/infotainment module disposed at a vehicle, the first electronic circuitry at least partially controls an advanced driver assistance system (ADAS) of the vehicle and the second electronic circuitry at least partially controls an infotainment system of the vehicle. A firewall restricts communication from the first electronic circuitry to the second electronic circuitry and the firewall restricts communication from the second electronic circuitry to the first electronic circuitry. A housing at least partially encapsulates the printed circuit board, and the housing is liquid cooled to transfer heat generated by the first electronic circuitry and the second electronic circuitry away from the printed circuit board.

9 Claims, 4 Drawing Sheets

(56)     References Cited

U.S. PATENT DOCUMENTS

| | | | |
|---|---|---|---|
| 2016/0006911 A1 | 1/2016 | Kimura et al. | |
| 2016/0119509 A1 | 4/2016 | Wato | |
| 2016/0337407 A1* | 11/2016 | King | H04L 63/102 |
| 2017/0310674 A1* | 10/2017 | Markham | H04W 12/04 |
| 2017/0322791 A1* | 11/2017 | Tiles | G06F 8/65 |
| 2018/0196763 A1* | 7/2018 | Fahmy | G11C 5/06 |
| 2018/0239223 A1 | 8/2018 | Blake, III et al. | |
| 2021/0011534 A1* | 1/2021 | Yin | H05K 7/20163 |
| 2024/0343194 A1 | 10/2024 | Cordeiro | |

* cited by examiner

20

22A        22B

PCB Assembly

24

ADAS/
Infotainment Connectors

ADAS-
Infotainment
PCBA

30        Housing

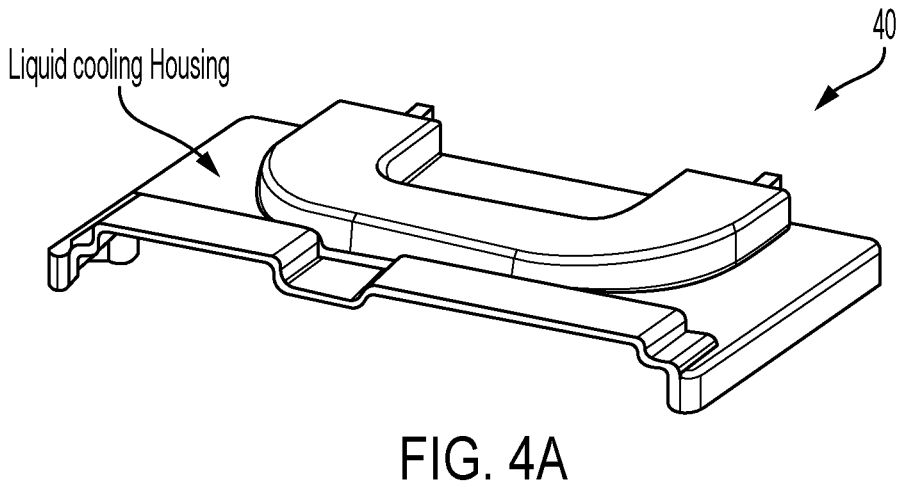
Liquid cooling Housing
40
FIG. 4A
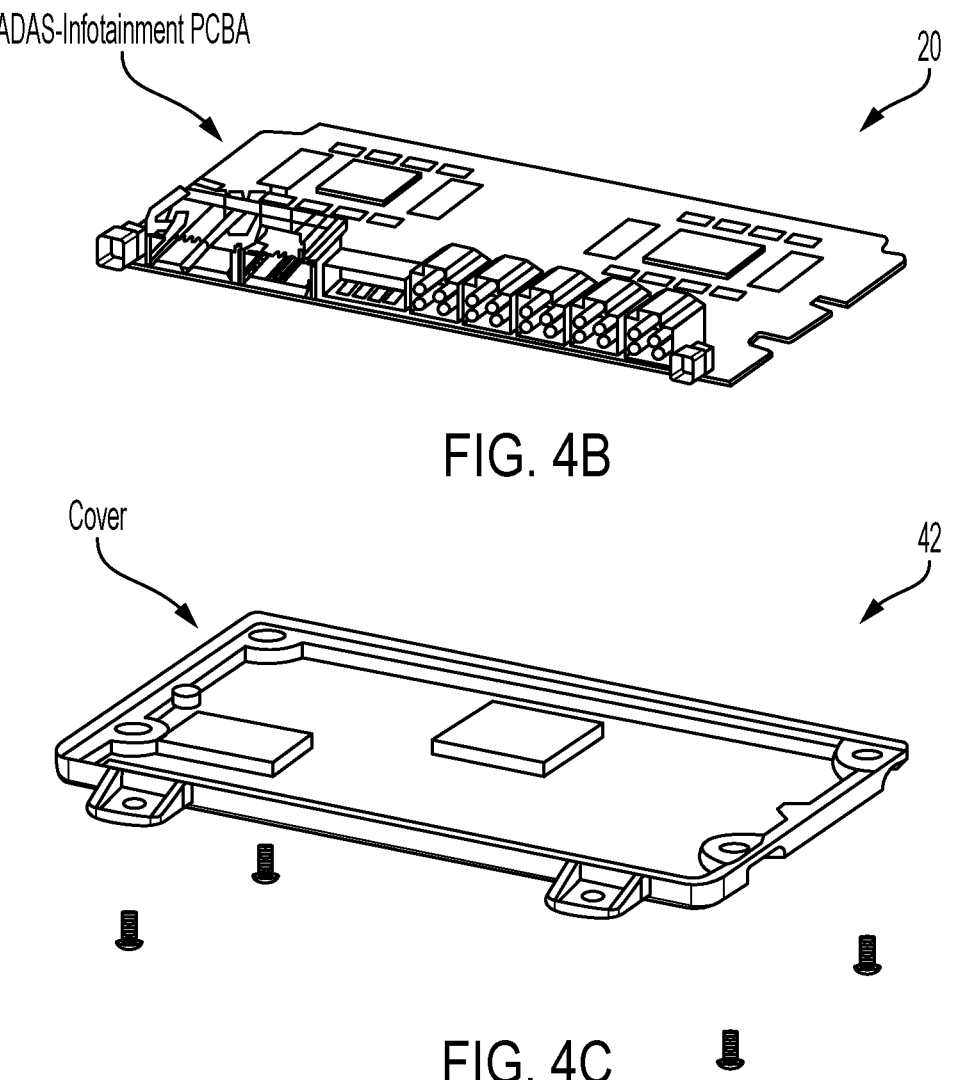
ADAS-Infotainment PCBA
20
FIG. 4B
Cover
42
FIG. 4C

50

VEHICULAR DRIVING ASSIST SYSTEM WITH INTEGRATED ADAS AND INFOTAINMENT CIRCUITRY

CROSS REFERENCE TO RELATED APPLICATION

The present application claims the filing benefits of U.S. provisional application Ser. No. 63/376,137, filed Sep. 19, 2022, which is hereby incorporated herein by reference in its entirety.

FIELD OF THE INVENTION

The present invention relates generally to advanced driver assistance systems and, more particularly, to a vehicle equipped with an advanced driver assistance system and an infotainment system.

BACKGROUND OF THE INVENTION

Use of advanced driver assistance systems in vehicles is common and known. These systems are often critical to operation of the vehicle and are thus protected by strict timing tolerances and cyber security requirements.

SUMMARY OF THE INVENTION

A vehicular integrated ADAS/infotainment module includes first electronic circuitry disposed at a printed circuit board and second electronic circuitry disposed at the printed circuit board. With the vehicular integrated ADAS/infotainment module disposed at a vehicle, (i) the first electronic circuitry at least partially controls an advanced driver assistance system (ADAS) of the vehicle and (ii) the second electronic circuitry at least partially controls an infotainment system of the vehicle. A firewall restricts communication from the first electronic circuitry to the second electronic circuitry. The firewall restricts communication from the second electronic circuitry to the first electronic circuitry. The vehicular integrated ADAS/infotainment module includes a housing that at least partially encapsulates the printed circuit board. The housing is liquid cooled to transfer heat generated by the first electronic circuitry and the second electronic circuitry away from the printed circuit board.

These and other objects, advantages, purposes and features of the present invention will become apparent upon review of the following specification in conjunction with the drawings.

BRIEF DESCRIPTION OF THE DRAWINGS

FIGS. 4A-4C are perspective views of a housing, the printed circuit board assembly of FIG. 2, and a cover of an integrated module.

DESCRIPTION OF THE PREFERRED EMBODIMENTS

An advanced driver or driving assist system (ADAS) operates to capture sensor data exterior of the vehicle and may process the captured sensor data to, for example, display images and/or to detect objects at or near the vehicle and in the predicted path of the vehicle, such as to assist a driver of the vehicle in maneuvering the vehicle in a rearward direction. The ADAS includes an electronic control unit (ECU) having a processor or processing system that is operable to receive sensor data from one or more sensors (e.g., cameras, radar sensors, lidar, ultrasonic sensors, etc.). The system may process sensor data at the ECU for object detection, pedestrian detection, collision avoidance, lane departure warning, lane keep assist, traffic sign recognition, automatic emergency braking and/or the like, and may provide autonomous or semi-autonomous control of the vehicle as the vehicle maneuvers along a road. The processor may provide an output to a display device for displaying images representative of the captured sensor data. Optionally, the ADAS may display a rearview display or a top down or bird's eye or surround view display or the like.

Figure 1:
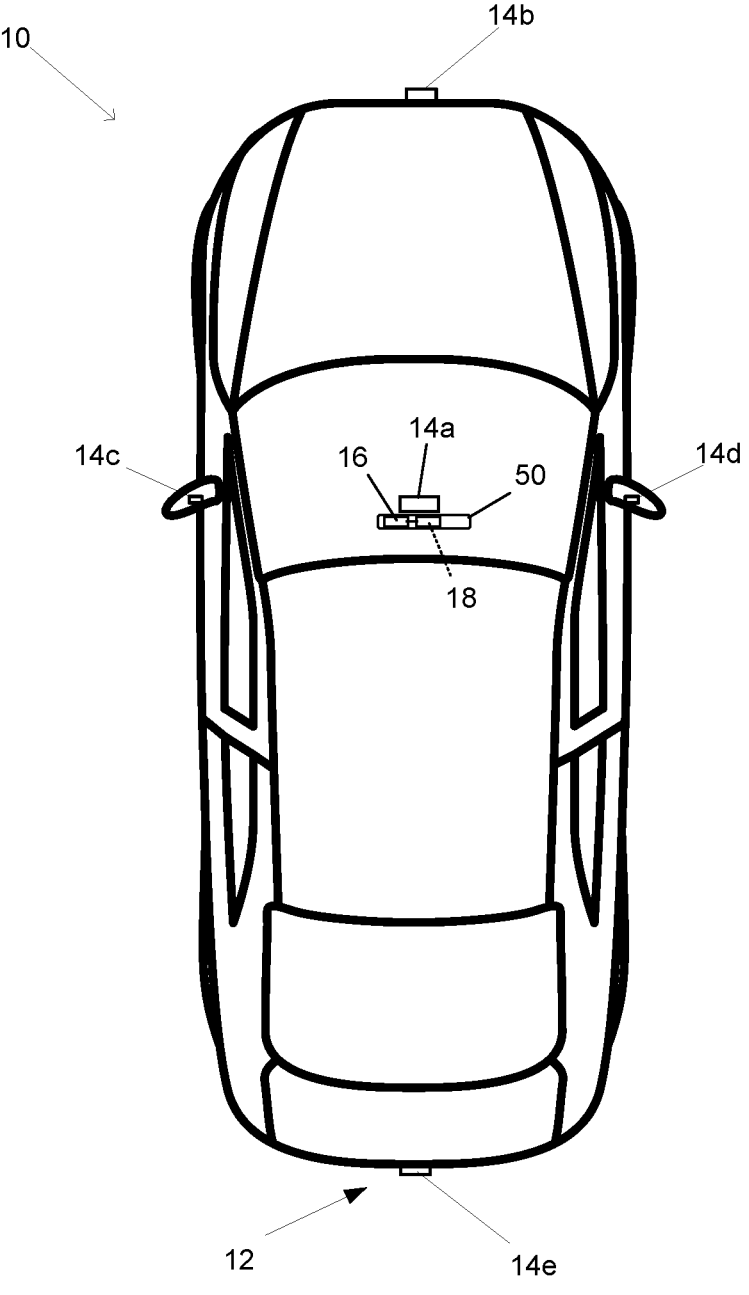
FIG. 1 is a plan view of a vehicle with a vision system that incorporates sensors, such as for a driving assistance system of the vehicle.

Referring now to the drawings and the illustrative embodiments depicted therein, a vehicle 10 includes an advanced driver assistance system 12 that includes at least one exterior viewing sensor (e.g., a camera, a radar sensor, lidar, etc.), such as a forward viewing camera 14a mounted at a windshield of the vehicle (and the system may optionally include multiple exterior viewing imaging sensors or cameras, such as a forward viewing camera 14b at the front of the vehicle, a sideward/rearward viewing camera 14c, 14d at respective sides of the vehicle, and/or a rearward viewing imaging sensor or camera 14e), which captures images exterior of the vehicle, with the camera having a lens for focusing images at or onto an imaging array or imaging plane or imager of the camera (FIG. 1). The forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The ADAS 12 includes an integrated module 50 that includes a control or electronic control unit (ECU) 18 having electronic circuitry and associated software, with the electronic circuitry including a data processor or image processor that is operable to process data captured by the sensors, whereby the ECU may detect or determine presence of objects or the like and/or the system may provide displayed images to an infotainment system 16 for viewing by the driver of the vehicle at a display of the vehicle. The data transfer or signal communication from the camera to the ECU may comprise any suitable data or communication link, such as a vehicle network bus or the like of the equipped vehicle.

Many vehicles include one or more advanced driver assistance systems along with an infotainment system (also referred to as an in-vehicle infotainment (IVI) system). Due to the differences in safety requirements between ADAS and infotainment systems, conventionally these systems include separate and independent printed circuit board (PCB) assemblies. However, this requires increased resources (e.g., cost, installation time, etc.) and space to accommodate both PCBs, in addition to any additional wiring necessary. Implementations herein merge the assemblies of an ADAS system and an infotainment system while maintaining functional safety requirements, timing tolerances, and cyber security requirements for each system independently.

Figure 2:
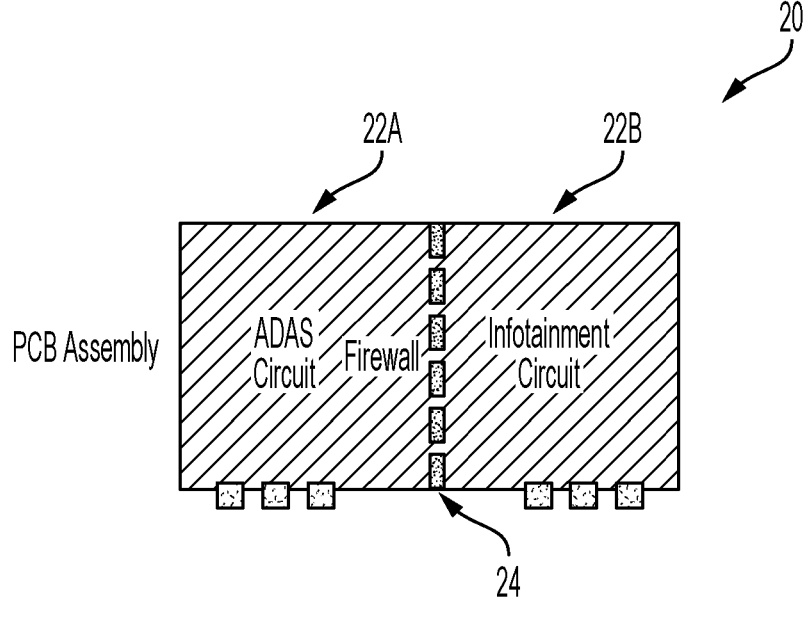
FIG. 2 is a schematic view of a printed circuit board assembly that includes both advanced driver assistance system (ADAS) circuitry and infotainment circuitry.

Referring now to FIG. 2, the integrated module 50 includes a printed circuit board assembly (PCBA) 20 that includes a first portion 22A with first circuitry dedicated to at least partially controlling/monitoring the ADAS and a second portion 22B with second circuitry dedicated to at least partially controlling/monitoring the infotainment system. The first portion 22A and the second portion 22B are divided by a firewall 24. While FIG. 2 illustrates the portions 22A, 22B as approximately equal, the firewall 24 may divide the PCBA 20 in any manner, resulting in any sized or shaped portions 22A, 22B.

The firewall 24 may be implemented via a hardware approach, a software approach, or any combination of the two. The firewall 24 restricts any unauthorized access to the ADAS domain (i.e., the circuitry of the first portion 22A) from the infotainment domain (i.e., the circuitry of the second portion 22B). That is, the firewall 24 ensures that the ADAS domain cannot be accessed from the infotainment domain. For example, the firewall 24 restricts communication vectors such as the Internet (e.g., via Ethernet or wireless connections), Universal Serial Bus (USB) controllers, Secure Digital (SD) cards, a controller area network (CAN) bus, a local interconnect network (LIN) bus, an inter-integrated circuit (I2C) bus, a serial peripheral interface (SPI) bus, etc., from accessing or interacting with the circuitry of the ADAS domain. The firewall 24 may also restrict any unauthorized access of the infotainment domain from the ADAS domain. That is, the firewall 24 may restrict access in both directions (i.e., from the ADAS domain to the infotainment domain and from the infotainment domain to the ADAS domain) or just one direction (i.e., from the infotainment domain to the ADAS domain).

The firewall 24 may be at least partially a hardware or physical firewall that ensures there is no sharing or only limited sharing of physical hardware resources between the first portion 22A and the second portion 22B. For example, the firewall 24 may include isolation techniques that isolate the first circuitry and the second circuitry (i.e., sufficient spacing between the first circuitry and second circuitry). The firewall 24 may also include a software firewall. The software firewall may be executed by a processor disposed at the first portion 22A, at the second portion 22B, at a third portion of the PCBA (i.e., a portion not included in the first portion 22A or the second portion 22B), or at a module remote from the PCBA 20 (such as by an ECU of the vehicle).

The firewall 24 may establish successful access between the ADAS and infotainment domains only upon authorized private access for specific purposes, such as for regular health monitoring, firmware updates, etc. The firewall 24 may be expanded to eliminate the challenges of accessing memory for both applications (i.e., ADAS applications and infotainment applications) without need of separate memory for each domain. That is, circuitry of the first portion 22A and the second portion 22B may share memory (e.g., volatile memory and/or nonvolatile memory). The firewall 24 may ensure that the first circuitry does not access memory reserved for the second circuitry and also ensure that the second circuitry does not access memory reserved for the first circuitry.

Figure 3:
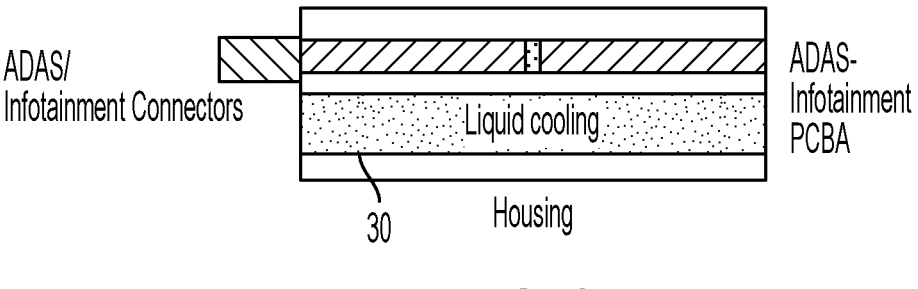
FIG. 3 is a sectional view of the printed circuit board assembly of FIG. 2 with a liquid cooling housing.

Referring now to FIG. 3, optionally the integrated module includes a housing with liquid cooling 30 to cool the circuitry of the PCBA 20. The integrated module may include separate connectors for both the first portion 22A of the PCBA 20 (i.e., ADAS connectors) and for the second portion 22B of the PCBA 20 (i.e., infotainment connectors). For example, the ADAS connectors are disposed at the first portion 22A and the infotainment connectors are disposed at the second portion 22B. In other examples, the integrated module includes shared connectors for both portions 22A, 22B.

Figure 5:
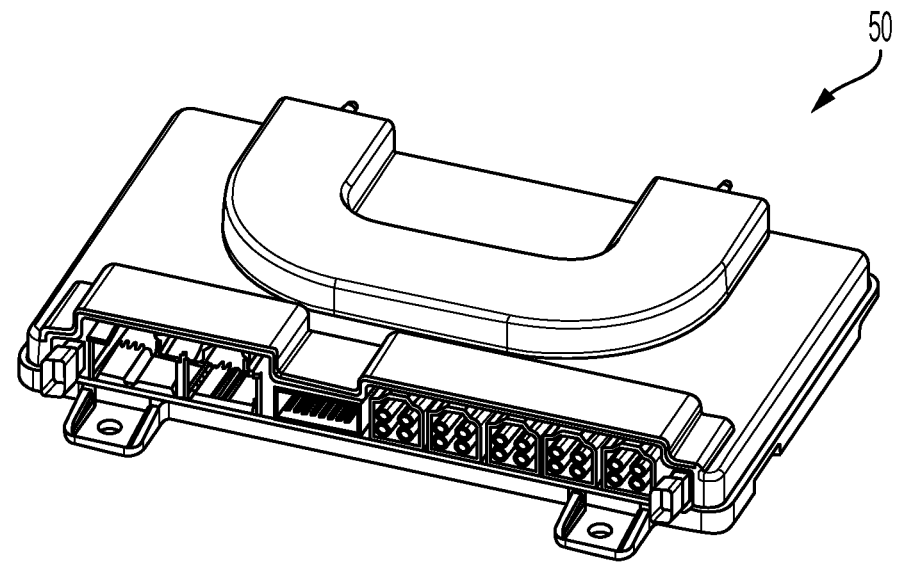
FIG. 5 is a perspective view of the integrated module of FIGS. 4A-4C.

Referring now to FIGS. 4A-4C, optionally, the liquid cooling 30 may be included within a liquid cooling housing 40 (FIG. 4A). The liquid cooling housing 40 may integrate with a cover 42 or other housing (FIG. 4C) to partially or fully encapsulate the PCBA 20 (FIG. 4B) and the liquid cooling components. The liquid cooling housing 40 may be in contact with the PCBA 20 in one or more spots via heat-conductive materials. The liquid cooling housing 40 may transfer heat from the PCBA 20 (i.e., the circuitry of the portions 22A, 22B) to liquid pumped through the liquid cooling housing 40. As shown in FIG. 5, the housing may include a number of ports to allow one or more connectors to connect to the PCBA 20 (e.g., Ethernet ports and the like).

The system includes an image processor operable to process data captured by the sensors (e.g., cameras, radar sensors, lidar, etc.), such as for detecting objects or other vehicles or pedestrians or the like in the field of view of one or more of the cameras or other sensors. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. The imaging array may comprise a CMOS imaging array having at least 300,000 photosensor elements or pixels, preferably at least 500,000 photosensor elements or pixels and more preferably at least one million photosensor elements or pixels arranged in rows and columns. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390;

5

9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in U.S. Pat. Nos. 10,071,687; 9,900,490; 9,126,525 and/or 9,036,026, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular integrated ADAS/infotainment module, the vehicular integrated ADAS/infotainment module comprising:

first electronic circuitry disposed at a first portion of a printed circuit board;

second electronic circuitry disposed at a second portion of the printed circuit board;

wherein, with the vehicular integrated ADAS/infotainment module disposed at a vehicle, (i) the first electronic circuitry at least partially controls an advanced driver assistance system (ADAS) of the vehicle and (ii) the second electronic circuitry at least partially controls an infotainment system of the vehicle;

wherein a firewall partitions the printed circuit board into the first portion and the second portion, and wherein the firewall comprises (i) a physical isolation region defined by spacing on the printed circuit board between the first electronic circuitry and the second electronic circuitry and (ii) a software firewall, and wherein the firewall restricts communication from the first electronic circuitry to the second electronic circuitry, and wherein the firewall restricts communication from the second electronic circuitry to the first electronic circuitry by utilizing the software firewall to block communication vectors originating from an external interface of the infotainment system from accessing the first electronic circuitry;

a housing that at least partially encapsulates the printed circuit board; and

wherein the housing is liquid cooled to transfer heat generated by the first electronic circuitry and the second electronic circuitry away from the printed circuit board.

2. The vehicular integrated ADAS/infotainment module of claim 1, wherein the external interface comprises at least one selected from the group consisting of (i) an Internet connection, (ii) a Universal Serial Bus (USB) connection, and (iii) a Secure Digital (SD) connection.

3. The vehicular integrated ADAS/infotainment module of claim 1, wherein the first electronic circuitry and the second electronic circuitry share memory.

4. The vehicular integrated ADAS/infotainment module of claim 1, wherein the firewall restricts unauthorized communication.

5. The vehicular integrated ADAS/infotainment module of claim 1, wherein the firewall does not restrict authorized communication.

6. The vehicular integrated ADAS/infotainment module of claim 5, wherein the authorized communication comprises at least one selected from the group consisting of (i) a health monitoring communication and (ii) a firmware update communication.

7. The vehicular integrated ADAS/infotainment module of claim 1, wherein the first portion comprises a first connector for communication with the first electronic circuitry, and wherein the second portion comprises a second connector for communication with the second electronic circuitry.

8. A vehicular integrated ADAS/infotainment module, the vehicular integrated ADAS/infotainment module comprising:

first electronic circuitry disposed at a first portion of a printed circuit board;

second electronic circuitry disposed at a second portion of the printed circuit board, wherein the first portion is different from the second portion;

wherein the first electronic circuitry and the second electronic circuitry share memory;

wherein, with the vehicular integrated ADAS/infotainment module disposed at a vehicle, (i) the first electronic circuitry at least partially controls an advanced driver assistance system (ADAS) of the vehicle and (ii) the second electronic circuitry at least partially controls an infotainment system of the vehicle;

wherein a firewall partitions the printed circuit board into the first portion and the second portion, and wherein the firewall comprises (i) a physical isolation region defined by spacing on the printed circuit board between the first electronic circuitry and the second electronic circuitry and (ii) a software firewall, and wherein the firewall restricts communication from the first electronic circuitry to the second electronic circuitry, and wherein the firewall restricts communication from the second electronic circuitry to the first electronic circuitry by utilizing the software firewall to block communication vectors originating from an external interface of the infotainment system from accessing the first electronic circuitry;

a housing that at least partially encapsulates the printed circuit board; and wherein the housing is liquid cooled to transfer heat generated by the first electronic circuitry and the second electronic circuitry away from the printed circuit board.

9. A vehicular integrated ADAS/infotainment module, the vehicular integrated ADAS/infotainment module comprising:

first electronic circuitry disposed at a first portion a printed circuit board;

second electronic circuitry disposed at a second portion of the printed circuit board;

wherein, with the vehicular integrated ADAS/infotainment module disposed at a vehicle, (i) the first electronic circuitry at least partially controls an advanced driver assistance system (ADAS) of the vehicle and (ii) the second electronic circuitry at least partially controls an infotainment system of the vehicle;

wherein a firewall partitions the printed circuit board into the first portion and the second portion, and wherein the firewall comprises (i) a physical isolation region defined by spacing on the printed circuit board between the first electronic circuitry and the second electronic circuitry and (ii) a software firewall, and wherein the firewall restricts communication from the first electronic circuitry to the second electronic circuitry, and wherein the firewall restricts communication from the second electronic circuitry to the first electronic circuitry by utilizing the software firewall to block communication vectors originating from an external interface of the infotainment system from accessing the first electronic circuitry;

a housing that at least partially encapsulates the printed circuit board;

wherein the external interface comprises at least one selected from the group consisting of (i) an Internet connection, (ii) a Universal Serial Bus (USB) connection, and (iii) a Secure Digital (SD) connection;

wherein the firewall does not restrict authorized communication, and wherein the authorized communication comprise at least one selected from the group consisting of (i) a health monitoring communication and (ii) a firmware update communication; and wherein the housing is liquid cooled to transfer heat generated by the first electronic circuitry and the second electronic circuitry away from the printed circuit board.

\* \* \* \* \*